(12) United States Patent
Kerber et al.

(10) Patent No.: US 8,610,188 B2
(45) Date of Patent: Dec. 17, 2013

(54) INTEGRATED CIRCUIT DECOUPLING CAPACITOR ARRANGEMENT

(75) Inventors: Andreas Kerber, White Plains, NY (US); Tanya Nigam, Sunnyvale, CA (US); Dieter Lipp, Goerlitz (DE); Marc Herden, Lauf (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 11 days.

(21) Appl. No.: 13/233,948

(22) Filed: Sep. 15, 2011

(65) Prior Publication Data
US 2013/0069131 A1    Mar. 21, 2013

(51) Int. Cl.
*H01L 27/108* (2006.01)
(52) U.S. Cl.
USPC ....... 257/296; 257/96; 257/307; 257/E27.016
(58) Field of Classification Search
USPC .............. 257/96, 307, 347, E27.016, 296
See application file for complete search history.

(56) References Cited

U.S. PATENT DOCUMENTS

| | | | |
|---|---|---|---|
| 3,619,716 A * | 11/1971 | Spira et al. | 315/244 |
| 5,243,301 A * | 9/1993 | Tondryk | 330/296 |
| 6,023,156 A * | 2/2000 | Buhler | 323/284 |
| 6,084,464 A * | 7/2000 | Lin | 327/525 |
| 6,204,723 B1 * | 3/2001 | Houghton et al. | 327/540 |
| 6,429,730 B2 * | 8/2002 | Houghton et al. | 327/540 |
| 6,604,226 B2 * | 8/2003 | Thorp et al. | 716/136 |
| 6,614,218 B1 * | 9/2003 | Ray | 324/117 R |
| 6,700,771 B2 * | 3/2004 | Bhattacharyya | 361/311 |
| 6,975,501 B1 * | 12/2005 | Baniecki et al. | 361/311 |
| 7,050,278 B2 * | 5/2006 | Poulsen | 361/31 |
| 7,177,135 B2 * | 2/2007 | Kim et al. | 361/301.2 |
| 7,342,434 B2 * | 3/2008 | Wakayama et al. | 327/530 |
| 7,655,518 B2 * | 2/2010 | Kim et al. | 438/239 |
| 2003/0193771 A1 * | 10/2003 | Liao | 361/306.2 |
| 2004/0085120 A1 * | 5/2004 | Pitts | 327/525 |
| 2004/0108587 A1 * | 6/2004 | Chudzik et al. | 257/700 |
| 2005/0023664 A1 * | 2/2005 | Chudzik et al. | 257/678 |
| 2005/0275449 A1 * | 12/2005 | Chen | 327/530 |
| 2006/0158123 A1 * | 7/2006 | Clavier | 315/77 |
| 2006/0237726 A1 * | 10/2006 | Iwamatsu et al. | 257/72 |
| 2007/0230087 A1 * | 10/2007 | Komaki | 361/306.2 |
| 2009/0051006 A1 * | 2/2009 | Schultz et al. | 257/532 |
| 2010/0078695 A1 * | 4/2010 | Law et al. | 257/296 |

(Continued)

FOREIGN PATENT DOCUMENTS

DE    10 2005 056 906 B4    1/2010

OTHER PUBLICATIONS

"Decoupling Capacitor Design Issued in 90NM CMOS," Xiongfei Meng, The University of British Columbia, Apr. 2006.

(Continued)

*Primary Examiner* — Michael Jung
*Assistant Examiner* — Ankush Singal
(74) *Attorney, Agent, or Firm* — Ingrassia Fisher & Lorenz, P.C.

(57) ABSTRACT

A decoupling capacitor arrangement is provided for an integrated circuit. The apparatus includes a plurality of decoupling capacitor arrays electrically connected in parallel with one another. Each of the arrays includes a plurality of decoupling capacitors and a current limiting element. The decoupling capacitors of each array are electrically connected in parallel with one another. The current limiting element is connected in series with the plurality of decoupling capacitors.

10 Claims, 2 Drawing Sheets

(56) References Cited

U.S. PATENT DOCUMENTS

| | | | |
|---|---|---|---|
| 2010/0148304 A1* | 6/2010 | Rahim et al. | 257/532 |
| 2012/0126763 A1* | 5/2012 | Yang | 323/282 |
| 2012/0224284 A1* | 9/2012 | Jalilizeinali et al. | 361/56 |
| 2012/0262217 A1* | 10/2012 | Gorbachov et al. | 327/382 |

OTHER PUBLICATIONS

"Decoupling Capacitance," Nitin Bhardwaj, University of Rochester, NY.

"Statistics of Successive Breakdown Events in Gate Oxides," J. Sune et al., IEEE Electron Device Letters, vol. 24, No. 4, Apr. 2003.

* cited by examiner

INTEGRATED CIRCUIT DECOUPLING CAPACITOR ARRANGEMENT

FIELD OF THE INVENTION

The present invention generally relates to an integrated circuit, and more particularly relates to a decoupling capacitor arrangement for use in an integrated circuit.

BACKGROUND OF THE INVENTION

Decoupling capacitors (DECAPs) are often used with integrated circuits, such as CMOS devices, in order to reduce power supply noise and otherwise keep power provided to the CMOS devices within specification. A typical arrangement of decoupling capacitors can be seen in FIG. 1, in which a plurality of decoupling capacitors are electrically connected in parallel with one another.

Unfortunately, with the arrangement shown in FIG. 1, time dependent dielectric breakdown (TDDB) of these decoupling capacitors frequently limits the power supply voltage ($V_{DD}$) utilized in the CMOS devices. One solution to this problem is to increase the thickness of the dielectric utilized in the decoupling capacitors. However, this solution leads to lower density of capacitors as well as decreased performance.

Accordingly, it is desirable to provide a decoupling capacitor arrangement to improve TDDB reliability without sacrificing overall performance of the integrated circuit. In addition, it is desirable to provide a decoupling capacitor arrangement to provide a higher and more stable $V_{DD}$ to the CMOS device. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A decoupling capacitor arrangement is provided for an integrated circuit. The apparatus includes a plurality of decoupling capacitor arrays electrically connected in parallel with one another. Each of the arrays includes a plurality of decoupling capacitors and a current limiting element. The decoupling capacitors of each array are electrically connected in parallel with one another. The current limiting element is connected in series with the plurality of decoupling capacitors.

An integrated circuit assembly is also provided. The assembly includes a power rail and a ground rail. A plurality of decoupling capacitor arrays are electrically connected in parallel with one another and electrically connected between the rails. Each array includes a plurality of decoupling capacitors electrically connected in parallel. Each array also includes a current limiting element electrically connected in series with the plurality of decoupling capacitors. The assembly further includes at least one logic element electrically connected between the rails.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Referring to the Figures, wherein like numerals indicate like parts throughout the several views, a decoupling capacitor arrangement 10 is shown and described herein. The arrangement 10 of the illustrated embodiment is part of an integrated circuit assembly 12. Typically, such an assembly 12 is disposed on a microchip (not shown) as is well known to those skilled in the art. Specifically, the assembly 12 of the illustrated embodiment is a complementary metal-oxide-semiconductor (CMOS) device (not separately numbered) having a plurality of logic devices 13. However, the arrangement 10 may be utilized with other electrical devices as will be appreciated by those skilled in the art.

Figure 2:
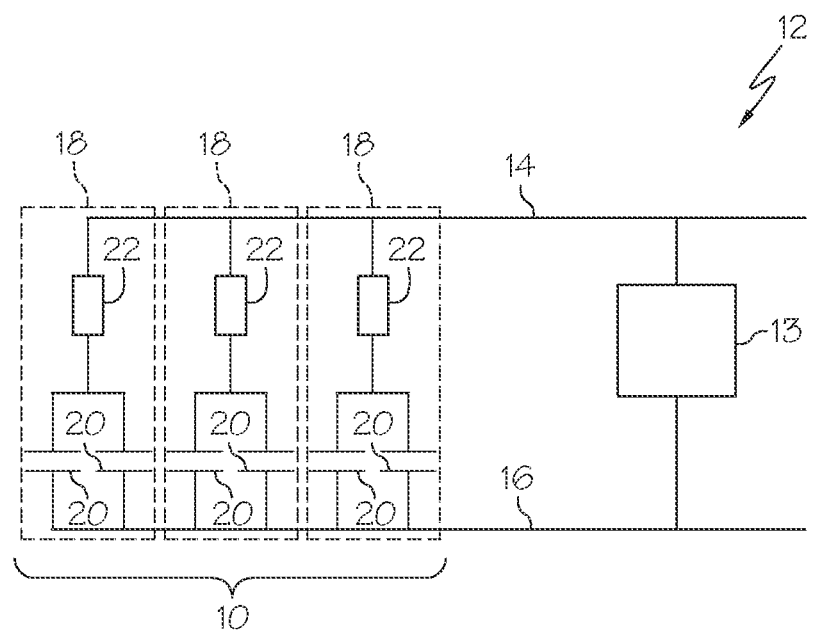
FIG. 2 is an electrical schematic showing an arrangement of decoupling capacitor arrays of the present invention.

Referring to FIG. 2, the assembly 12 includes a power rail 14 and a ground rail 16. In the case of the CMOS device of the illustrated embodiment, the rails 14, 16 are electrically connected to pins (not shown) such that a voltage may be provided across the pins, and thus across the rails 14, 16, by an external power supply (not shown). The power rail 14 of the illustrated embodiment carries a drain voltage ($V_{DD}$) and the ground rail 16 carries a source voltage ($V_{SS}$), which is commonly referred to as ground and often abbreviated GND.

The arrangement 10 includes a plurality of decoupling capacitor arrays 18. The arrays 18 are electrically connected in parallel with one another. FIG. 2 shows three arrays 18; however, any number of arrays 18 may alternatively be implemented based on size, performance, or other concerns.

Each array 18 includes a plurality of decoupling capacitors 20 and a current limiting element 22. The decoupling capacitors 20 of each array 18 are electrically connected in parallel with one another. The current limiting element 22 of each array 18 is electrically connected in series with the decoupling capacitors 20 of that particular array 18, and is described in greater detail below. FIG. 2 shows two decoupling capacitors 20 per array 18; however, any number of decoupling capacitors 18 may alternatively be implemented based on size, performance, or other concerns.

In the illustrated embodiment, the current limiting elements 22 are each electrically connected to the power rail 14 while the decoupling capacitors 20 are each electrically connected to the ground rail 16. However, in alternative embodiments (not shown), the decoupling capacitors 20 may be electrically connected to the power rail 14 while the current limiting elements 22 are electrically connected to the ground rail 16.

Figure 3:
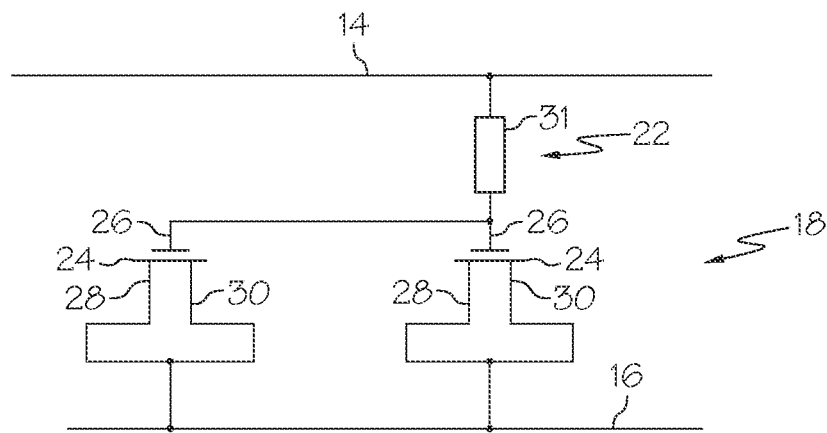
FIG. 3 is an electrical schematic showing one of the decoupling capacitor arrays with the decoupling capacitors implemented as MOSFETs.

Referring now to FIG. 3, at least one of the decoupling capacitors 20 is a metal-oxide-semiconductor field-effect transistor 24 (MOSFET). In the illustrated embodiment, each of the decoupling capacitors 20 is implemented with a MOSFET 24. Each MOSFET 24 includes a gate 26, a drain 28, and a source 30. The gate of the MOSFET 24 is electrically connected to the current limiting element 22. The drain and source of the MOSFET 24 are electrically connected together and to the ground rail 16. However, other suitable devices configurations for implementing the decoupling capacitor 20 may alternatively be implemented. Furthermore, each decoupling capacitor 20 need not be identical to one another in design, sizing, or other implementation.

The current limiting element 22 functions to either limit post breakdown gate current supplied to the MOSFETs 24 or to disconnect failing MOSFETs 24 altogether. In one embodiment, the current limiting element 22 is implemented as a resistor 31. More specifically, the resistor 31 is implemented as a polycrystalline silicon (poly or poly-Si) resistor. In the illustrated embodiment, the resistor has a resistance R of 500Ω, which limits post breakdown gate current, i.e., the fail current, to 2 mA at a $V_{DD}$ of 1 V. The resistance of the resistor 31 may be different in other embodiments of the arrangement 10 based on various considerations, such as the voltage utilized, the capacitance of the capacitor, and the allowable current through the capacitor. The resistance of the various resistors 31 in the plurality of arrays 18 may also have different values. Furthermore, in other embodiments (not shown), the current limiting element 22 may be implemented with a fuse, such as a metal fuse element.

Figure 4:
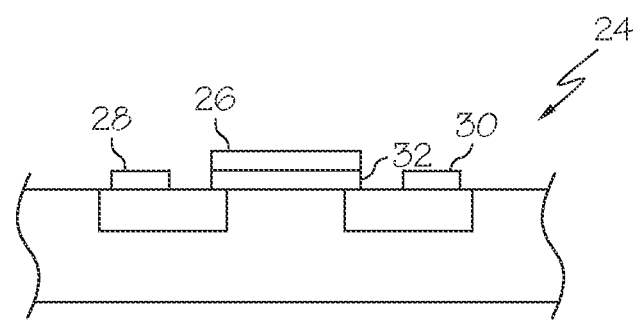
FIG. 4 is a cross-sectional view of one of the MOSFETs.

The gate 26 of the MOSFET 24 of the illustrated embodiment includes a gate oxide (GOX) dielectric layer 32, as shown in FIG. 4. In the illustrated embodiment, this GOX dielectric layer has a thickness of 2 nm, which results in a 0.15 pF/$\mu m^2$ capacitance density. With an operating frequency of 2 GHz and a 50% duty factor, the RC time constant τ is calculated as 125 ps. Accordingly, the capacitance C of the MOSFET 24 implementation of the decoupling capacitor 20 is calculated as 0.25 pF by dividing the RC time constant τ by the resistance (C=τ/R). The area of the GOX dielectric layer 32 is then found to be 1.67 $\mu m^2$ by dividing the capacitance of 0.25 pF by the capacitance density of 0.15 pF/$\mu m^2$. Thus, the GOX dielectric layer 32 in the illustrated embodiment has an area of about 1.67 $\mu m^2$.

The capacitance of the decoupling capacitors 20 may be different in other embodiments of the arrangement based on various considerations. Accordingly, the thickness and area of the GOX dielectric layer 32 of the MOSFET 24 implemented as the decoupling capacitor 20 may likewise be varied.

Figure 1:
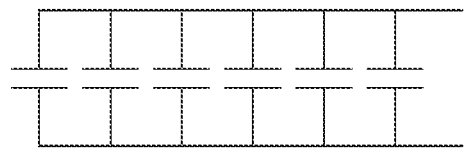
FIG. 1 is an electrical schematic showing an arrangement of decoupling capacitors according to the prior art.

The arrangement 10 of decoupling capacitors 20 and current limiting elements 22 described herein provides improved time dependent dielectric breakdown (TDDB) when compared to prior art decoupling capacitors, such as those shown in FIG. 1. Specifically, the decoupling capacitors 20 of the subject application may suffer successive fails (e.g., 2, 3, 4, . . . N) yet increase lifetime for the overall assembly 12 as only the logic devices 13 of the assembly 12 need be considered for Poisson scaling and low failure percentile projection. (Those skilled in the art realize that TDDB failure distribution typically follows a Poisson scaling.) Furthermore, the arrangement 10 also enables a higher drain voltage ($V_{DD}$) on the power rail 14 to be provided to the CMOS devices of the assembly 12.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An integrated circuit assembly comprising:
   a power rail and a ground rail;
   a plurality of decoupling capacitor arrays electrically connected in parallel with one another and electrically connected between said rails, wherein each array comprises
   a plurality of decoupling capacitors electrically connected in parallel, and
   a single current limiting element electrically connected in series with said plurality of decoupling capacitors; and
   at least one logic element electrically connected between said rails.

2. An assembly as set forth in claim 1 wherein at least one of the current limiting elements is a resistor.

3. An assembly as set forth in claim 1 wherein at least one of the current limiting elements is a fuse.

4. An assembly as set forth in claim 1 wherein at least one of the decoupling capacitors is a metal-oxide-semiconductor field-effect transistor (MOSFET).

5. An assembly as set forth in claim 1 wherein said power rail is electrically connected to said current limiting element.

6. An assembly as set forth in claim 1 wherein said ground rail is electrically connected to said plurality of decoupling capacitors.

7. An assembly as set forth in claim 2 wherein said resistor has a resistance of about 500Ω.

8. An assembly as set forth in claim 4 wherein said MOSFET provides a decoupling capacitance of about 0.25 pF.

9. An assembly as set forth in claim 4 wherein said MOSFET includes a gate electrically connected to said current limiting element.

10. An assembly as set forth in claim 4 wherein said MOSFET includes a drain and a source electrically connected together and to said ground rail.

* * * * *